United States Patent
Bazargan et al.

(10) Patent No.: US 10,267,842 B2
(45) Date of Patent: Apr. 23, 2019

(54) METHOD FOR IDENTIFYING A FAULTED DC POWER TRANSMISSION MEDIUM IN A MULTI-TERMINAL DC ELECTRICAL NETWORK

(71) Applicant: General Electric Technology GmbH, Baden (CH)

(72) Inventors: Masoud Bazargan, Stafford (GB); Kyriaki Maleka, Stafford (GB)

(73) Assignee: General Electric Technology GmbH, Baden (CH)

( * ) Notice: Subject to any disclaimer, the term of this patent is extended or adjusted under 35 U.S.C. 154(b) by 310 days.

(21) Appl. No.: 15/024,810

(22) PCT Filed: Sep. 26, 2013

(86) PCT No.: PCT/EP2013/070131
§ 371 (c)(1),
(2) Date: Mar. 24, 2016

(87) PCT Pub. No.: WO2015/043644
PCT Pub. Date: Apr. 2, 2015

(65) Prior Publication Data
US 2016/0216311 A1   Jul. 28, 2016

(51) Int. Cl.
*G01R 31/11* (2006.01)
*G01R 31/08* (2006.01)
(Continued)

(52) U.S. Cl.
CPC ........... *G01R 31/088* (2013.01); *H02H 7/265* (2013.01); *H02H 7/268* (2013.01); *H02H 7/28* (2013.01)

(58) Field of Classification Search
CPC ...... G01R 31/088; H02H 7/268; H02H 7/265; H02H 7/28
See application file for complete search history.

(56) References Cited

U.S. PATENT DOCUMENTS

| 4,766,549 A | 8/1988 | Schweitzer et al. |
| 5,682,100 A | 10/1997 | Rossi et al. |

FOREIGN PATENT DOCUMENTS

WO    WO 2013/131782 A1    9/2013

OTHER PUBLICATIONS

Nanayakkara et al. Traveling-Wave-Based Line Fault Location in Star-Connected Multi-terminal HVDC Systems, IEEE Trans. On Power Delivery, vol. 27, No. 4, Oct. 2012, pp. 2286-2294.*

(Continued)

*Primary Examiner* — Melissa J Koval
*Assistant Examiner* — Courtney G McDonnough
(74) *Attorney, Agent, or Firm* — Foley & Lardner LLP

(57) ABSTRACT

A method for identifying a faulted DC power transmission medium in a multi-terminal DC electrical network is provided. The DC electrical network includes multiple terminals connected via DC power transmission media. The method includes detecting a fault occurring in the DC power transmission media and, after detecting the fault, measuring a surge arrival time at each terminal, each surge arrival time being the difference between the time of detecting the fault and the time of arrival of an electrical wave surge generated by the fault at the corresponding terminal. The method further includes comparing the surge arrival times between the terminals to identify DC power transmission media in which the fault is not located, allocating a healthy status to the media in which the fault is not located, and identifying the faulted DC power transmission medium as being the DC power transmission medium/media without a healthy status.

11 Claims, 9 Drawing Sheets

(51) Int. Cl.
  *H02H 7/26* (2006.01)
  *H02H 7/28* (2006.01)

(56) References Cited

OTHER PUBLICATIONS

International Search Report and Written Opinion, PCT Application No. PCT/EP2013/070131, 6 pages (dated Jun. 2, 2014).
Jian, Qin et al., "Travelling Wave Fault Location of Transmission Line Using Wavelet Transform," Electric Power Research Institute, Electric Power Research Institute, Proc. Int. Conf. Power Syst. Technol., vol. 1, pp. 533-537 (1998).
Kwon, Young-Jin et al., "Fault Location Algorithm Based on Cross Correlation Method for HVDC Cable Lines," IET $9^{th}$ International Conference on Developments in Power System Protection, No. 0-132, pp. 360-364 (Mar. 2008).
Nanayakkara, O.M.K. Kasun et al., "Location of DC Line Faults in Conventional HVDC Systems with Segments of Cables and Overhead Lines Using Terminal Measurements," IEEE Transactions on Power Delivery, vol. 27, No. 1, pp. 279-288 (Jan. 2012).

* cited by examiner

| Cable Lengths | | | | |
|---|---|---|---|---|
| L1 [km] | L2 [km] | L3 [km] | L4 [km] | L5 [km] |
| 80 | 50 | 75 | 40 | 90 |

| | | |
|---|---|---|
| If | $\lvert t_1 - t_4 \rvert < L_1/u_1$ | |
| If | $t_1 < t_4$ | $t_4 < t_1$ |
| Check if | $t_4 = t_3 + L_4/u_4$ | $t_1 = t_2 + L_2/u_2$ |
| Check if | - | $t_1 = t_3 + L_5/u_5$ |
| If | $\lvert t_1 - t_2 \rvert < L_2/u_2$ | |
| If | $t_1 < t_2$ | $t_2 < t_1$ |
| Check if | $t_2 = t_3 + L_3/u_3$ | $t_1 = t_3 + L_5/u_5$ |
| Check if | - | $t_1 = t_4 + L_1/u_1$ |
| If | $\lvert t_2 - t_3 \rvert < L_3/u_3$ | |
| If | $t_2 < t_3$ | $t_3 < t_2$ |
| Check if | $t_3 = t_1 + L_5/u_5$ | $t_2 = t_1 + L_2/u_2$ |
| Check if | $t_3 = t_4 + L_4/u_4$ | - |
| If | $\lvert t_4 - t_3 \rvert < L_4/u_4$ | |
| If | $t_4 < t_3$ | $t_3 < t_4$ |
| Check if | $t_3 = t_1 + L_5/u_5$ | $t_4 = t_1 + L_1/u_1$ |
| Check if | $t_3 = t_2 + L_3/u_3$ | - |
| If | $\lvert t_1 - t_3 \rvert < L_5/u_5$ | |
| If | $t_1 < t_3$ | $t_3 < t_1$ |
| Check if | $t_3 = t_2 + L_3/u_3$ | $t_1 = t_2 + L_2/u_2$ |
| Check if | $t_3 = t_4 + L_4/u_4$ | $t_1 = t_4 + L_1/u_1$ |

Figure 4

|  | Outer radius [m] | Resistivity [Ω·m] | Relative Permittivity |
|---|---|---|---|
| Conductor | 0.0104 | $2.82 \cdot 10^{-8}$ | |
| Insulator1 | 0.016 | | 4.1 |
| Sheath | 0.0205 | $1.86 \cdot 10^{-8}$ | |
| Insulator2 | 0.0215 | | 2.3 |

Figure 5

| Propagation speeds | | | | |
|---|---|---|---|---|
| $u_1$ [km/s] | $u_2$ [km/s] | $u_3$ [km/s] | $u_4$ [km/s] | $u_5$ [km/s] |
| 145503.7 | 145602.8 | 145033.5 | 146742.2 | 144622.8 |

Figure 6

| Travel Time Values if the fault is not located on the corresponding DC power transmission medium | | | | |
|---|---|---|---|---|
| $L_1/u_1$ [s] | $L_2/u_2$ [s] | $L_3/u_3$ [s] | $L_4/u_4$ [s] | $L_5/u_5$ [s] |
| 0.000550 | 0.000343 | 0.000517 | 0.000273 | 0.000622 |

Figure 7

| Fault Located Between T1 and T4 |||||||
|---|---|---|---|---|---|---|
| Xact [km] | t1 [s] | t2 [s] | t3 [s] | t4 [s] | Xest [km] | Error [%] |
| 17 | 1.000115 | 1.000455 | 1.000705 | 1.000430 | 17.083 | 0.10 |
| 40 | 1.000270 | 1.000610 | 1.000540 | 1.000270 | 40.000 | 0.00 |
| 61 | 1.000415 | 1.000760 | 1.000395 | 1.000125 | 61.098 | 0.12 |
| Xact [km] | \|t1 - t4\| [s] | \|t1 - t2\| [s] | \|t2 - t3\| [s] | \|t4 - t3\| [s] | \|t1 - t3\| [s] ||
| 17 | 0.000315 | 0.000340 | 0.000250 | 0.000275 | 0.000590 ||
| 17 | Faulty | Healthy (second stage) | Healthy (first stage) | Healthy (first stage) | Healthy (third stage) ||
| 40 | 0.000000 | 0.000340 | 0.000070 | 0.000270 | 0.000270 ||
| 40 | Faulty | Healthy (first stage) | Healthy (first stage) | Healthy (first stage) | Healthy (first stage) ||
| 61 | 0.000290 | 0.000345 | 0.000365 | 0.000270 | 0.000020 ||
| 61 | Faulty | Healthy (first stage) | Healthy (first stage) | Healthy (second stage) | Healthy (first stage) ||

Figure 8

| Fault Located Between T1 and T2 ||||||||
|---|---|---|---|---|---|---|---|
| Xact [km] | t1 [s] | t2 [s] | t3 [s] | t4 [s] | Xest [km] | Error [%] ||
| 13 | 1.000085 | 1.000250 | 1.000700 | 1.000630 | 12.988 | 0.02 ||
| 28 | 1.000190 | 1.000145 | 1.000660 | 1.000735 | 28.276 | 0.55 ||
| 49 | 1.000335 | 1.000005 | 1.000515 | 1.000795 | 49.024 | 0.005 ||
| Xact [km] | \|t1 - t4\| [s] | \|t1 – t2\| [s] | \|t2 - t3\| [s] | \|t4 - t3\| [s] | \|t1 - t3\| [s] |||
| 13 | 0.000545 | 0.000165 | 0.000450 | 0.000070 | 0.000615 |||
| 13 | Healthy (second stage) | Faulty | Healthy (first stage) | Healthy (first stage) | Healthy (second stage) |||
| 28 | 0.000545 | 0.000045 | 0.000515 | 0.000075 | 0.000470 |||
| 28 | Healthy (first stage) | Faulty | Healthy (second stage) | Healthy (first stage) | Healthy (first stage) |||
| 49 | 0.000460 | 0.000330 | 0.000510 | 0.000280 | 0.000180 |||
| 49 | Healthy (first stage) | Faulty | Healthy (second stage) | Healthy (first stage) | Healthy (first stage) |||

Figure 9

| Fault Located Between T2 and T3 ||||||||
| --- | --- | --- | --- | --- | --- | --- |
| Xact [km] | t1 [s] | t2 [s] | t3 [s] | t4 [s] | Xest [km] | Error [%] |
| 10 | 1.000405 | 1.000065 | 1.000445 | 1.000720 | 9.944 | 0.08 |
| 46 | 1.000655 | 1.000310 | 1.000195 | 1.000465 | 45.839 | 0.21 |
| 67 | 1.000670 | 1.000455 | 1.000050 | 1.000320 | 66.869 | 0.17 |
| Xact [km] | $|t1 - t4|$ [s] | $|t1 - t2|$ [s] | $|t2 - t3|$ [s] | $|t4 - t3|$ [s] | $|t1 - t3|$ [s] ||
| 10 | 0.000315 | 0.000340 | 0.000380 | 0.000275 | 0.000040 ||
| | Healthy (first stage) | Healthy (second stage) | Faulty | Healthy (first stage) | Healthy (first stage) ||
| 46 | 0.000190 | 0.000345 | 0.000115 | 0.000270 | 0.000460 ||
| | Healthy (first stage) | Healthy (first stage) | Faulty | Healthy (second stage) | Healthy (third stage) ||
| 67 | 0.000350 | 0.000215 | 0.000405 | 0.000270 | 0.000620 ||
| | Healthy (first stage) | Healthy (first stage) | Faulty | Healthy (second stage) | Healthy (second stage) ||

Figure 10

| Fault Located Between T4 and T3 | | | | | | |
|---|---|---|---|---|---|---|
| Xact [km] | t1 [s] | t2 [s] | t3 [s] | t4 [s] | Xest [km] | Error [%] |
| 4 | 1.000570 | 1.000760 | 1.000245 | 1.000025 | 3.858 | 0.35 |
| 16 | 1.000650 | 1.000675 | 1.000160 | 1.000105 | 15.965 | 0.09 |
| 34 | 1.000655 | 1.000550 | 1.000040 | 1.000230 | 33.941 | 0.15 |
| Xact [km] | \|t1 - t4\| [s] | \|t1 – t2\| [s] | \|t2 - t3\| [s] | \|t4 - t3\| [s] | \|t1 - t3\| [s] | |
| 4 | 0.000545 | 0.000190 | 0.000515 | 0.000220 | 0.000325 | |
| 4 | Healthy (second stage) | Healthy (first stage) | Healthy (first stage) | Faulty | Healthy (first stage) | |
| 16 | 0.000545 | 0.000025 | 0.000515 | 0.000055 | 0.000490 | |
| 16 | Healthy (second stage) | Healthy (first stage) | Healthy (first stage) | Faulty | Healthy (first stage) | |
| 34 | 0.000425 | 0.000105 | 0.000510 | 0.000190 | 0.000615 | |
| 34 | Healthy (first stage) | Healthy (first stage) | Healthy (second stage) | Faulty | Healthy (second stage) | |

Figure 11

| Fault Located Between T1 and T3 | | | | | | |
|---|---|---|---|---|---|---|
| Xact [km] | t1 [s] | t2 [s] | t3 [s] | t4 [s] | Xest [km] | Error [%] |
| 20 | 1.000135 | 1.000475 | 1.000480 | 1.000680 | 20.053 | 0.06 |
| 43 | 1.000290 | 1.000630 | 1.000320 | 1.000590 | 42.831 | 0.19 |
| 76 | 1.000520 | 1.000605 | 1.000090 | 1.000365 | 76.094 | 0.10 |

| Xact [km] | \|t1 - t4\| [s] | \|t1 - t2\| [s] | \|t2 - t3\| [s] | \|t4 - t3\| [s] | \|t1 - t3\| [s] |
|---|---|---|---|---|---|
| 20 | 0.000545 | 0.000340 | 0.000005 | 0.000200 | 0.000345 |
| 20 | Healthy (second stage) | Healthy (second stage) | Healthy (first stage) | Healthy (first stage) | Faulty |
| 43 | 0.000300 | 0.000340 | 0.000310 | 0.000270 | 0.000030 |
| 43 | Healthy (third stage) | Healthy (second stage) | Healthy (first stage) | Healthy (first stage) | Faulty |
| 76 | 0.000155 | 0.000085 | 0.000515 | 0.000275 | 0.000430 |
| 76 | Healthy (first stage) | Healthy (first stage) | Healthy (second stage) | Healthy (second stage) | Faulty |

Figure 12

METHOD FOR IDENTIFYING A FAULTED DC POWER TRANSMISSION MEDIUM IN A MULTI-TERMINAL DC ELECTRICAL NETWORK

CROSS-REFERENCE TO RELATED APPLICATIONS

The present application is a National Stage of International Application No. PCT/EP2013/070131, filed Sep. 26, 2013, the entire contents of which are hereby incorporated by reference.

This invention relates to a method for identifying a faulted DC power transmission medium in a multi-terminal DC electrical network.

A new class of high voltage direct current (HVDC) power transmission networks are being considered for moving large quantities of power over long distances, as required by geographically dispersed renewable forms of generation, and to augment existing capabilities of AC and DC power transmission networks with smartgrid intelligence and features that are able to support modern electricity trading requirements. Such a network is sometimes referred to as a DC power grid.

A DC power grid requires multi-terminal interconnection of HVDC converters, whereby power can be exchanged on the DC side using three or more HVDC converters operating in parallel. Each HVDC converter acts as either a source or sink to maintain the overall input-to-output power balance of the network whilst exchanging the power as required. Such interconnection is carried out using DC power transmission media to interconnect different terminals of the DC power grid.

A DC power transmission medium may be any medium that is capable of transmitting electrical power between two or more DC terminals. Such a medium may be, but is not limited to, a submarine DC power transmission cable, an overhead DC power transmission line, or a combination of an overhead DC power transmission line and an underground DC power transmission cable.

The occurrence of a fault in a plurality of DC power transmission media forming part of the DC power grid may lead to a fault current flowing through the DC power grid. The fault may, for example, be in the form of a short circuit with low impedance across a pair of DC power transmission media. This may occur due to damage or breakdown of insulation, lightning strikes, movement of conductors or other accidental bridging between conductors by a foreign object. Upon the occurrence of a fault in the plurality of the DC power transmission media, protection of the DC power grid, together with fast and accurate identification of the faulted DC power transmission medium, is important to enable rapid restoration of power to the DC power grid.

One proposed methodology of protecting the DC power grid is by tripping all DC circuit interruption devices associated with the DC power grid before carrying out a faulted DC power transmission medium location identification procedure. However, this results in the entire DC power grid being out of service during the faulted DC power transmission medium identification procedure, thus not only inconveniencing end-users of the DC power grid, but also potentially affecting stability of the connected AC power grid.

For the purposes of this specification, opening a circuit interruption device refers to the use of the circuit interruption device to open a closed circuit to interrupt current flow in the circuit, while closing a circuit interruption device refers to the use of the circuit interruption device to complete an open circuit to permit current flow in the circuit. A DC circuit interruption device may be any device that is capable of interrupting direct current flow in a DC circuit. Such a DC circuit interruption device may be, but is not limited to, a DC circuit breaker.

According to an aspect of the invention, there is provided a method for identifying a faulted DC power transmission medium in a multi-terminal DC electrical network, the DC electrical network including a plurality of terminals, each terminal being connected to at least one other terminal via a respective one of a plurality of DC power transmission media, the method comprising the steps of:

(a) detecting a fault occurring in the plurality of DC power transmission media;

(b) after detecting the fault, measuring a surge arrival time at each terminal, each surge arrival time being the difference between the time of detecting the fault and the time of arrival of an electrical wave surge at the corresponding terminal, the electrical wave surge being generated by the fault;

(c) comparing the surge arrival time at each terminal with the surge arrival time at at least one other terminal to identify the or each DC power transmission medium in which the fault is not located;

(d) allocating a healthy status to the or each DC power transmission medium in which the fault is not located;

(e) identifying the faulted DC power transmission medium as being in the DC power transmission medium without a healthy status or among a plurality of DC power transmission media without a healthy status.

The occurrence of the fault in the plurality of DC power transmission media of the DC electrical network leads to generation of an electrical wave surge which propagates from the location of the fault along both directions of the faulted DC power transmission medium in which the fault is located, and to the rest of the DC electrical network, i.e. the plurality of terminals and the other DC power transmission media. This in turn results in variation between the surge arrival times among the plurality of DC power transmission media, the values of the surge arrival times being dependent on the topology of the DC electrical network and the electrical characteristics of the plurality of DC power transmission media.

The variation between the surge arrival times among the plurality of DC power transmission media means that it is possible to compare the surge arrival time at each terminal with the surge arrival time with at least one other terminal to identify the or each healthy DC power transmission medium, i.e. the or each DC power transmission medium in which the fault is not located. In this manner the method according to the invention enables the faulted DC power transmission medium to be identified, by way of elimination of the or each healthy DC power transmission medium, as being a specific DC power transmission medium or to be narrowed down to being in part of the DC electrical network, i.e. among a plurality of DC power transmission media forming part of the DC electrical network.

Measurement of each surge arrival time can be carried out locally at each terminal and comparison of the surge arrival times can be carried out rapidly through communication between different terminals or a central control station (both of which are typical features of a multi-terminal DC electrical network), thereby resulting in a straightforward and rapid identification of the faulted DC power transmission medium. This has the benefit of minimising the amount of time of zero power transmission in the DC electrical network, thus minimising inconvenience to the end users.

The ability to narrow down the identity of the faulted DC power transmission medium to being in part of the DC electrical network can be advantageous in circumstances when the DC electrical network is not configured to be capable of withstanding the fault current for a sufficiently long period to allow the method according to the invention to identify the faulted DC power transmission medium as being a specific DC power transmission medium. This is because one or more of the plurality of DC power transmission media would have been already allocated a healthy status by the time the DC circuit interruption devices are tripped, and so the or each healthy DC power transmission medium can be kept in service, thus requiring only part of the DC electrical network to be temporarily out of service.

The method according to the invention therefore not only provides a simple, accurate and reliable method of identifying a faulted DC power transmission medium in a multi-terminal DC network, but also minimises the inconvenience to end users by allowing at least part of the DC electrical network to remain in service following occurrence of a fault.

The method according to the invention can be carried out in different ways, each way being based on measurement and comparison of the surge arrival times at the plurality of terminals to identify the or each healthy DC power transmission medium, i.e. the or each DC power transmission medium in which the fault is not located.

In embodiments of the invention, the step of comparing the surge arrival time at each terminal with the surge arrival time at at least one other terminal to identify the or each DC power transmission medium in which the fault is not located may involve the sub-step of identifying the or each terminal with a smallest surge arrival time from the measured surge arrival times followed by a first stage including the sub-step or sub-steps of:
  (f) if two terminals are each identified as having the smallest surge arrival time, identifying the DC power transmission medium directly connecting the two identified terminals as being the DC power transmission medium in which the fault is located, and identifying each other DC power transmission medium as being the DC power transmission medium in which the fault is not located;
  (g) if one terminal is identified as having the smallest surge arrival time, identifying the or each DC power transmission medium which is not directly connected to the identified terminal as being the DC power transmission medium in which the fault is not located.

Using the smallest surge arrival time as a reference for identifying the or each healthy DC power transmission medium provides a simple and quick way of identifying or narrowing down the identity of the faulted DC power transmission medium.

In further embodiments of the invention, the step of comparing the surge arrival time at each terminal with the surge arrival time at at least one other terminal to identify the or each DC power transmission medium in which the fault is not located may involve the sub-step of identifying the terminal with a smallest surge arrival time from the measured surge arrival times followed by a second stage including the sub-steps of:
  (h) selecting one terminal which is not the identified terminal with the smallest surge arrival time;
  (i) determining the difference between the smallest surge arrival time and the surge arrival time at that selected terminal;
  (j) if the difference between the smallest surge arrival time and the surge arrival time at the selected terminal is equal or higher than a travel time for the DC power transmission medium directly connecting the identified and selected terminals, identifying the DC power transmission medium directly connecting the identified and selected terminals as being the DC power transmission medium in which the fault is not located, wherein a travel time for a DC power transmission medium is equal to a time required for an electrical wave to travel along that DC power transmission medium between the two terminals which are directly connected to that DC power transmission medium.

The second stage may be repeated for each other terminal which is not the identified terminal with the smallest surge arrival time.

The second stage provides an alternative way of comparing the surge arrival times to identify or narrow down the location of the fault. The second stage not only compares the surge arrival time at each terminal to at least one other terminal, but also compares the difference between surge arrival times with a predefined reference value, i.e. the travel time for a particular DC power transmission medium. The use of predefined reference values adds reliability to the determination of whether a particular DC power transmission medium is healthy.

The first stage may be followed by the second stage. Such combination of the first and second stages permits identification or further narrowing down of the location of the fault in the event that only one terminal was identified as having the smallest surge arrival time in the first stage.

In still further embodiments of the invention, the step of comparing the surge arrival time at each terminal with the surge arrival time at at least one other terminal to identify the or each DC power transmission medium in which the fault is not located may involve the sub-steps of:
  (k) determining each path to each terminal from each other terminal, wherein each path includes at least one of the plurality of DC power transmission media, a first end of each path being connected to one of the plurality of terminals, a second end of the path being connected to another of the plurality of terminals;
  (l) determining a travel time for each path, wherein the travel time for each path is the time required for an electrical wave to travel along that path between the two terminals which are directly connected to the first and second ends of that path,
followed by a third stage including the sub-steps of:
  (m) selecting one of the plurality of DC power transmission media, and selecting the terminals directly connected to the selected DC power transmission medium as a first selected terminal and a second selected terminal;
  (n) determining whether the surge arrival time at the first selected terminal is lower or higher than the surge arrival time at the second selected terminal;
  (o) selecting one path in which one of its first and second ends is directly connected to the selected terminal with the higher surge arrival time and the other of its first and second ends is not directly connected to the selected terminal with the lower surge arrival time;
  (p) comparing the surge arrival time at the selected terminal with the higher surge arrival time with the sum value of a travel time for the selected path and the surge arrival time at the terminal connected to the other end of the selected path;

(q) if the surge arrival time at the selected terminal with the higher surge arrival time is equal to the sum value, identifying the DC power transmission medium directly interconnecting the first and second selected terminals as the DC power transmission medium in which the fault is not located.

Preferably sub-steps (o), (p), (q) are repeated for each other path in which one of its first and second ends is directly connected to the selected terminal with the higher surge arrival time and the other of its first and second ends is not directly connected to the selected terminal with the lower surge arrival time.

Further preferably the third stage is repeated for each of the other plurality of DC power transmission media.

The second stage may be followed by the third stage. Such combination of the second and third stages permits identification or further narrowing down of the identity of the faulted DC power transmission medium in the event that the second stage failed to identify the faulted DC power transmission medium as being a specific DC power transmission medium.

Furthermore, when the second stage is followed by the third stage, the third stage may be only carried out in respect of each DC power transmission medium which has not been identified in the second stage as being the DC power transmission medium in which the fault is not located. This reduces the number of times required to repeat the third stage and thereby shortens the time taken to identify the faulted DC power transmission medium, thus increasing the chances of identifying the faulted DC power transmission medium as being a specific DC power transmission medium before the DC circuit interruption devices are tripped.

Optionally the method may further include the step of, if only one of the plurality of DC power transmission media does not have a healthy status, determining the location of the fault along the length of that DC power transmission medium using the following equation:

$$x_F = \frac{L - \Delta t \cdot U}{2}$$

wherein $x_F$ is the location of the fault along the length of that DC power transmission medium, L is the length of the DC power transmission medium, $\Delta t$ is the difference between the surge arrival times at the terminals directly connected to that DC power transmission medium and U is the propagation speed of the electrical wave surge.

The step of determining the location of the fault along the length of that DC power transmission medium using the above equation may be carried out before or after tripping the DC circuit interruption devices.

It will be appreciated that each of the first, second and third stages can be carried out separately or, for example as indicated above, in combination with each other.

Preferred embodiments of the invention will now be described, by way of non-limiting examples, with reference to the accompanying drawings in which:

FIG. 4 shows, in table form, a summary of the different paths which can be travelled by an electrical surge wave in the DC electrical network of FIG. 1;

FIG. 5 shows, in table form, electrical characteristics of each DC power transmission medium of the DC electrical network of FIG. 1;

FIG. 6 shows, in table form, the propagation speed for each DC power transmission medium;

Figures 1, 2:
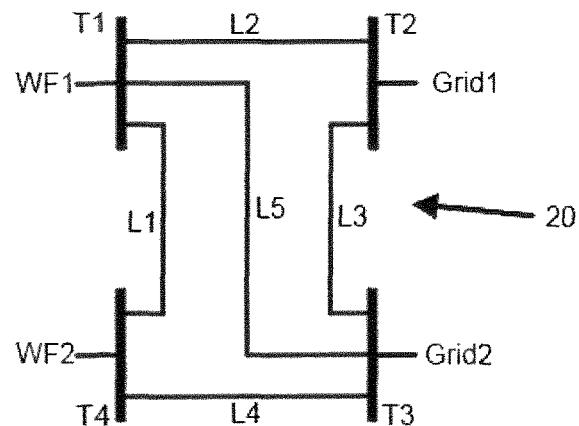
FIG. 1 shows, in schematic form, a meshed multi-terminal DC electrical network.
FIG. 2 shows, in table form, the lengths of the plurality of DC power transmission media forming part of the DC electrical network of FIG. 1.

FIG. 7 shows, in table form, a travel time for each DC power transmission medium which was calculated using the DC power transmission lengths in FIG. 2 and propagation speeds in FIG. 6; and FIGS. 8 to 12 show, in table form, different examples of the results of a simulation in which one of the plurality of DC power transmission media is considered as being the faulted DC power transmission medium in which the fault is located.

A meshed multi-terminal DC electrical network 20 is shown in FIG. 1.

The DC electrical network 20 includes four DC terminals T1,T2,T3,T4. The first terminal T1 is connected to a first wind farm WF1. The second terminal T2 is a connection to a first AC power grid, Grid1. The third terminal T3 is a connection to a second AC power grid, Grid2. The fourth terminal T4 is connected to a second wind farm WF2.

The first terminal T1 is connected to the fourth terminal T4 via a first DC power transmission medium L1. The first terminal T1 is also connected to the second terminal T2 via a second DC power transmission medium L2. The second terminal T2 is connected to the third terminal T3 via a third DC power transmission medium L3. The third terminal T3 is connected to the fourth terminal T4 via a fourth DC power transmission medium L4. The first terminal T1 is further connected to the third terminal T3 via a fifth DC power transmission medium L5.

As shown in FIG. 2, the first DC power transmission medium L1 is 80 km long, the second DC power transmission medium L2 is 50 km long, the third DC power transmission medium L3 is 75 km long, the fourth DC power transmission medium L4 is 50 km long and the fifth DC power transmission medium L5 is 80 km long. It will be appreciated that the lengths mentioned here are merely illustrative and the length of each DC power transmission medium L1,L2,L3,L4,L5 may vary depending on the requirements of the DC electrical network 20.

The occurrence of a fault in the plurality of DC power transmission media L1,L2,L3,L4,L5 may lead to a fault current flowing through the DC electrical network 20. This leads to generation of an electrical wave surge which propagates from the location of the fault along both directions of the faulted DC power transmission medium in which the fault is located, and to the rest of the DC electrical network 20, i.e. the plurality of terminals T1,T2,T3,T4 and the other DC power transmission media.

The topology of the meshed multi-terminal DC electrical network 20 of FIG. 1 means that the electrical wave surge can reach each terminal through more than one path. Each such path includes at least one of the plurality of DC power transmission media L1,L2,L3,L4,L5. A first end of each such path is connected to one of the plurality of terminals T1,T2,T3,T4, and a second end of the path is connected to another of the plurality of terminals T1,T2,T3,T4.

As an example, one such path can be formed by the fourth and fifth DC power transmission media L4,L5, whereby the first end of the path is connected to the first terminal T1, and a second end of the path is connected to the fourth terminal T4. Another such path can be formed by the third and fourth DC power transmission media L3,L4, whereby the first end of the path is connected to the second terminal T2, and a second end of the path is connected to the fourth terminal T4.

Therefore, each path can vary in distance, and so the electrical wave surge can reach each terminal through more than one path of variable distances.

The DC electrical network 20 further includes a plurality of DC circuit interruption devices (not shown) which can be tripped to cause one or more of the plurality of DC power transmission media L1,L2,L3,L4,L5 to be out of service.

Figure 3:
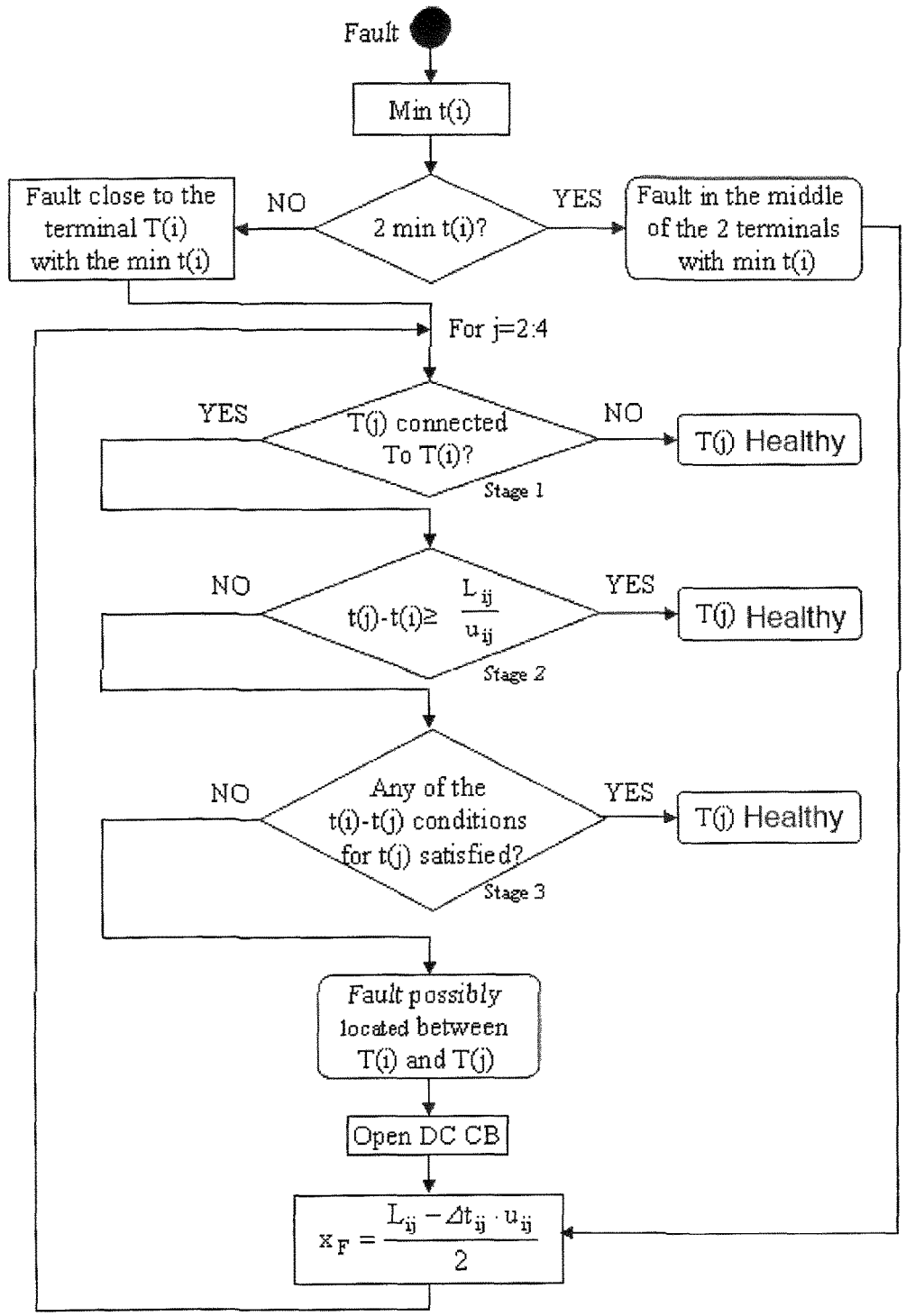
FIG. 3 shows a method according to an embodiment of the invention.

A method of identifying a faulted DC power transmission medium in the meshed multi-terminal DC electrical network 20 of FIG. 1 is described as follows and is shown in FIG. 3.

The method is based on reduction to absurdity (or elimination of non-compliant solution) in that the method identifies each DC power transmission medium L1,L2,L3,L4,L5 in which a fault is not located, allocates a healthy status to each DC power transmission medium L1,L2,L3,L4,L5 in which the fault is not located and, by way of elimination, identifies the faulted DC power transmission medium as being the DC power transmission medium L1,L2,L3,L4,L5 without a healthy status.

Initially, following the occurrence of the fault, a step of detecting the fault using fault detection equipment is performed. Thereafter, a step of measuring a surge arrival time at each terminal T1,T2,T3,T4 is performed. Each surge arrival time at each terminal T1,T2,T3,T4 is the difference between the time of detecting the fault and the time of arrival of the aforementioned electrical wave surge at that terminal T1,T2,T3,T4.

The step of measuring the surge arrival times is followed by the step of comparing the surge arrival time at each terminal T1,T2,T3,T4 with the surge arrival time at each of the other terminals T1,T2,T3,T4. In this manner it is possible to perform the sub-step of identifying the or each terminal T1,T2,T3,T4 with a smallest surge arrival time from the measured surge arrival times.

The sub-step of identifying the or each terminal T1,T2,T3,T4 with the smallest surge arrival time is followed by a first stage which is described as follows.

The first stage includes the sub-step of, if any two terminals T1,T2,T3,T4 are each identified as having the smallest surge arrival time, identifying the DC power transmission medium L1,L2,L3,L4,L5 directly connecting the two identified terminals T1,T2,T3,T4 as being the DC power transmission medium L1,L2,L3,L4,L5 in which the fault is located. In this sub-step, each other DC power transmission medium L1,L2,L3,L4,L5 is determined as being the DC power transmission medium L1,L2,L3,L4,L5 in which the fault is not located and thereby is allocated a healthy status. For example, if the first and second terminals T1,T2 each have the smallest surge arrival time, the second DC power transmission medium L2 is identified as being the DC power transmission media in which the fault is located, and so the first, third, fourth and fifth DC power transmission media L1,L3,L4,L5 are determined as being the DC power transmission media in which the fault is not located and thereby are allocated a healthy status.

In this manner the faulted DC power transmission medium can be successfully identified by the first stage of the method of FIG. 3.

On the other hand, the first stage also includes the sub-step of, if any one terminal T1,T2,T3,T4 is identified as having the smallest surge arrival time, identifying each DC power transmission medium L1,L2,L3,L4,L5 which is not directly connected to the identified terminal as being the DC power transmission medium L1,L2,L3,L4,L5 in which the fault is not located. For example, if the first terminal T1 has the smallest surge arrival time, the third and fourth DC power transmission media L3,L4 are identified as being the DC power transmission media in which the fault is not located and thereby are allocated a healthy status.

In this manner the identity of the faulted DC power transmission medium can be at least narrowed down to being in part of the DC electrical network 20 using the first stage of the method of FIG. 3.

The first stage is followed by the second stage.

As shown in FIG. 3, the second stage includes the sub-step of selecting one terminal T1,T2,T3,T4 which is directly connected to a DC power transmission medium L1,L2,L3,L4,L5 without a healthy status after the first stage, but is not the identified terminal T1,T2,T3,T4 with the smallest surge arrival time. This is followed by the sub-step of determining the difference between the smallest surge arrival time and the surge arrival time at that selected terminal T1,T2,T3,T4.

The second stage further includes the sub-step of, if the difference between the smallest surge arrival time and the surge arrival time at the selected terminal T1,T2,T3,T4 is equal or higher than a travel time for the DC power transmission medium L1,L2,L3,L4,L5 directly connecting the identified and selected terminals T1,T2,T3,T4, the DC power transmission medium L1,L2,L3,L4,L5 directly connecting the identified and selected terminals T1,T2,T3,T4 is identified as being the DC power transmission medium L1,L2,L3,L4,L5 in which the fault is not located and thereby is allocated a healthy status.

A travel time for a DC power transmission medium L1,L2,L3,L4,L5 is equal to a time required for an electrical wave to travel along that DC power transmission medium L1,L2,L3,L4,L5 between the two terminals T1,T2,T3,T4 which are directly connected to that DC power transmission medium L1,L2,L3,L4,L5. The travel time can be calculated by dividing the length of the DC power transmission medium L1,L2,L3,L4,L5 by the propagation velocity in the DC power transmission medium L1,L2,L3,L4,L5.

If the difference between the smallest surge arrival time and the surge arrival time at the selected terminal T1,T2,T3,T4 is lower than a travel time for the DC power transmission medium L1,L2,L3,L4,L5 directly connecting the identified and selected terminals T1,T2,T3,T4, the DC power transmission medium L1,L2,L3,L4,L5 directly connecting the identified and selected terminals T1,T2,T3,T4 is identified as being the DC power transmission medium L1,L2,L3,L4,L5 in which the fault may be located and thereby is not allocated a healthy status.

The second stage is repeated for each other terminal T1,T2,T3,T4 which is directly connected to a DC power transmission medium L1,L2,L3,L4,L5 without a healthy status after the first stage, but is not the identified terminal T1,T2,T3,T4 with the smallest surge arrival time.

In this manner the faulted DC power transmission medium can therefore be either successfully identified or the identity of the faulted DC power transmission medium can be further narrowed down using the second stage of the method of FIG. 3.

The second stage is followed by the third stage.

As mentioned above, the electrical wave surge can reach each terminal T1,T2,T3,T4 through more than one path of variable distances. Moreover, the measured surge arrival time at a terminal T1,T2,T3,T4 indicates only the time taken for the electrical surge wave to reach that terminal T1,T2, T3,T4, without taking into consideration the path or direction travelled by the electrical surge wave.

Prior to the third stage, a sub-step of determining a travel time for each path is performed. The travel time for each path is the time required for an electrical wave to travel along that path between the two terminals T1,T2,T3,T4 which are directly connected to the first and second ends of that path. The travel time for each path is preferably determined before initiation of the method of FIG. 3.

The third stage includes the sub-step of selecting one of the plurality of DC power transmission media L1,L2,L3,L4, L5 which has not been allocated a healthy status by the end of the second stage. In this sub-step, the terminals T1,T2, T3,T4 directly connected to the selected DC power transmission medium L1,L2,L3,L4,L5 are then selected as a first selected terminal and a second selected terminal T1,T2,T3, T4.

Following selection of the first and second selected terminals T1,T2,T3,T4, a sub-step of determining whether the surge arrival time at the first selected terminal T1,T2,T3,T4 is lower or higher than the surge arrival time at the second selected terminal T1,T2,T3,T4 is performed. This is followed by the sub-step of selecting a path with one of its first and second ends directly connected to the selected terminal T1,T2,T3,T4 with the higher surge arrival time and with the other of its first and second ends not directly connected to the selected terminal T1,T2,T3,T4 with the lower surge arrival time.

For example, if the first and fourth terminals T1,T4 are the first and second selected terminals respectively and the first terminal T1 has the higher surge arrival time, a path consisting of the fourth DC power transmission medium L4 may be selected since one end of the fourth DC power transmission medium L4 is directly connected to the fourth terminal T4 and the other end of the fourth DC power transmission medium L4 is not directly connected to the first terminal T1.

Thereafter, the sub-step of comparing the surge arrival time at the selected terminal T1,T2,T3,T4 with the higher surge arrival time to the sum value of a travel time for the selected path and the surge arrival time at the terminal T1,T2,T3,T4 connected to the other end of the selected path is performed. The third stage further includes the sub-step of, if the surge arrival time at the selected terminal T1,T2, T3,T4 with the higher surge arrival time is equal to the sum value, identifying the DC power transmission medium L1,L2,L3,L4,L5 directly interconnecting the first and second selected terminals T1,T2,T3,T4 as the DC power transmission medium L1,L2,L3,L4,L5 in which the fault is not located and thereby is allocated a healthy status.

The foregoing is repeated for each other path with one end directly connected to the selected terminal T1,T2,T3,T4 with the higher surge arrival time and with another end not directly connected to the selected terminal T1,T2,T3,T4 with the lower surge arrival time.

The third stage is repeated for each other DC power transmission medium L1,L2,L3,L4,L5 which has not been allocated a healthy status by the end of the second stage.

FIG. 4 shows, in table form, a summary of the different paths which can be selected during the third stage in order to identify each DC power transmission medium L1,L2,L3, L4,L5 in which the fault is not located.

After the third stage, only one of the plurality of DC power transmission media L1,L2,L3,L4,L5 without a healthy status will be left, and so the faulted DC power transmission medium is identified as being that DC power transmission medium L1,L2,L3,L4,L5 without a healthy status.

In this manner the faulted DC power transmission medium can therefore be successfully identified using the third stage of the method of FIG. 3.

The provision of the first and second stages preceding the third stage reduces the number of times required to repeat the third stage and thereby shortens the time taken to identify the faulted DC power transmission medium, thus increasing the chances of identifying the faulted DC power transmission medium as being a specific DC power transmission medium L1,L2,L3,L4,L5 before the DC circuit interruption devices are tripped.

It can be seen from the method according to the invention that it is possible for the faulted DC power transmission medium to be successfully identified at any of the first, second and third stages. Thus, it is envisaged that, in other embodiments, the method may include one or two of the first, second and third stages, instead of all three stages.

Furthermore, even when the DC electrical network 20 is not configured to be capable of withstanding the fault current for a sufficiently long period to allow the method of FIG. 3 to identify the faulted DC power transmission medium as being a specific DC power transmission medium L1,L2,L3,L4,L5, the method of FIG. 3 enables the identity of the faulted DC power transmission medium to be narrowed down to being in a certain part of the DC electrical network 20. This is because one or more of the plurality of DC power transmission media L1,L2,L3,L4,L5 would have been already allocated a healthy status by the time the DC circuit interruption devices are tripped, and so the or each healthy DC power transmission medium can be kept in service, thus requiring only part of the DC electrical network 20 to be temporarily out of service.

Finally, after the DC circuit interruption devices are tripped, the location of the fault along the length of the DC power transmission medium L1,L2,L3,L4,L5 without a healthy status is determined using the following equation:

$$x_F = \frac{L - \Delta t \cdot U}{2} \qquad (1)$$

wherein $x_F$ is the location of the fault along the length of that DC power transmission medium L1,L2,L3,L4,L5; L is the length of the DC power transmission medium L1,L2,L3,L4, L5; $\Delta t$ is the difference between the surge arrival times at the terminals T1,T2,T3,T4 directly connected to that DC power transmission medium L1,L2,L3,L4,L5; and U is the propagation speed of the electrical wave surge.

Optionally determination of the location of the fault along the length of that DC power transmission medium L1,L2, L3,L4,L5 using the above equation may be carried out before tripping the DC circuit interruption devices.

A simulation of the meshed multi-terminal DC electrical network 20 of FIG. 1 was carried out in accordance with the method of FIG. 3. The structure and electrical characteristics of each DC power transmission medium L1,L2,L3,L4,L5 is shown in FIG. 5, and the length of each DC power transmission medium L1,L2,L3,L4,L5 is shown in FIG. 2.

More particularly, each DC power transmission lines L1,L2,L3,L4,L5 has a conductor enclosed within a first insulator, Insulator1, and the first insulator, Insulator1, is enclosed within a sheath that itself is enclosed within a second insulator, Insulator2. The sheath of each DC power transmission lines L1,L2,L3,L4,L5 has an outer radius of 0.0104 m and an electrical resistivity of $2.82 \times 10$ $\Omega \cdot$m. The conductor of each DC power transmission lines L1,L2,L3, L4,L5 has an outer radius of 0.016 m and a relative permittivity of 4.1. The conductor of each DC power transmission lines L1,L2,L3,L4,L5 has an outer radius of 0.0205 m and an electrical resistivity of $1.86 \times 10^{-8}$ Ω·m. The conductor of each DC power transmission lines L1,L2,L3,L4,L5 has an outer radius of 0.0215 m and a relative permittivity of 2.3.

The propagation speed for a DC power transmission medium L1,L2,L3,L4,L5 is determined using a fault test in which a high pulse (that represents a fault) is injected at a specific location along the DC power transmission medium L1,L2,L3,L4,L5 and the propagation speed is calculated by using surge arrival time measurements at both terminals of each DC power transmission medium L1,L2,L3,L4,L5.

The propagation speeds for the plurality of DC power transmission media L1,L2,L3,L4,L5 shown in FIG. 1 are calculated by using the aforementioned fault test. The propagation speeds for each DC power transmission media L1,L2,L3,L4,L5 can be obtained from Equations 4 to 8. For better accuracy, each fault test is repeated multiple times by injecting the high pulse at different locations along each DC power transmission medium L1,L2,L3,L4,L5 and using an average value as the propagation speed of each DC power transmission medium L1,L2,L3,L4,L5.

$$u_1 = (L_1 - 2 \cdot x_{F_1})/(t_4 - t_1) \quad (2)$$

$$u_2 = (L_2 \cdot 2 \cdot x_{F_2})/(t_2 - t_1) \quad (3)$$

$$u_3 = (L_3 - 2 \cdot x_{F_3})/(t_3 - t_2) \quad (4)$$

$$u_4 = (L_4 - 2 \cdot x_{F_4})/(t_3 - t_4) \quad (5)$$

$$u_5 = (L_5 - 2 \cdot x_{F_5})/(t_3 - t_1) \quad (6)$$

where u is the propagation speed for a DC power transmission medium L1,L2,L3,L4,L5;
 L is the length of a DC power transmission medium L1,L2,L3,L4,L5;
 $x_F$ is the location of the injected high pulse along a DC power transmission medium L1,L2,L3,L4,L5;
 t is the surge arrival time at a terminal of a DC power transmission medium L1,L2,L3,L4,L5.

FIG. 6 shows, in table form, the propagation speed for each DC power transmission medium L1,L2,L3,L4,L5. The propagation speed for a DC power transmission medium L1,L2,L3,L4,L5 is the speed at which an electrical wave travels through that DC power transmission medium L1,L2, L3,L4,L5. The propagation speeds for the first, second, third, fourth and fifth DC power transmission media L1,L2, L3,L4,L5 are 145503.7 km/s, 145602 km/s, 145033.5 km/s, 146742.2 km/s and 144622.8 km/s respectively.

FIG. 7 shows, in table form, the travel time for each DC power transmission medium L1,L2,L3,L4,L5 which was calculated using the DC power transmission lengths in FIG. 2 and propagation speeds in FIG. 6. The travel times for the first, second, third, fourth and fifth DC power transmission media L1,L2,L3,L4,L5 are 0.000550 s, 0.000343 s, 0.000517 s, 0.000273 s and 0.000622 s respectively. Each travel time shown in FIG. 7 applies to the corresponding DC power transmission medium L1,L2,L3,L4,L5 if the fault is not located on that DC power transmission medium L1,L2, L3,L4,L5.

In the model, a permanent line-to-ground fault is simulated as being in one of the plurality of DC power transmission media L1,L2,L3,L4,L5.

FIG. 8 shows, in table form, a first example of the results of the simulation for when the first DC power transmission medium L1 is considered as being the faulted DC power transmission medium in which the fault is located.

FIG. 9 shows, in table form, a second example of the results of the simulation for when the second DC power transmission medium L2 is considered as being the faulted DC power transmission medium in which the fault is located.

FIG. 10 shows, in table form, a third example of the results of the simulation for when the third DC power transmission medium L3 is considered as being the faulted DC power transmission medium in which the fault is located.

FIG. 11 shows, in table form, a fourth example of the results of the simulation for when the fourth DC power transmission medium L4 is considered as being the faulted DC power transmission medium in which the fault is located.

FIG. 12 shows, in table form, a fifth example of the results of the simulation for when the fifth DC power transmission medium L5 is considered as being the faulted DC power transmission medium in which the fault is located.

In each example, the fault is simulated as being located at three different points Xact along the length of the faulted DC power transmission medium L1,L2,L3,L4,L5 in which the fault is located. For all of the examples, the fault occurs at t=1 s.

Each of FIGS. 8 to 12 also includes the estimated location Xest of the fault along the length of the faulted DC power transmission medium L1,L2,L3,L4,L5 in which the fault is located, whereby the estimated location is calculated using the aforementioned Equation 1. Each of FIGS. 8 to 12 also includes an error value which represents the percentage error between the estimated location and the actual location Xact, as calculated using the following Equation 7.

$$\text{Error}(\%) = \frac{|\text{Estimated Location} - \text{Actual Location}|}{\text{Length of Cable}} \cdot 100 \quad (7)$$

(FIRST EXAMPLE) AS SHOWN IN FIG. 8

In the first example, Xact is the distance of the fault from the first terminal T1 along the length of the faulted DC power transmission medium L1.

For Xact=17 km, the measured surge arrival times for the plurality of terminals T1,T2,T3,T4 are 1.000115 s, 1.000455 s, 1.000705 s and 1.000430 s respectively.

In the first stage, the first terminal T1 is identified as having the smallest surge arrival time. Hence, the third and fourth DC power transmission media L3,L4 are each identified as being the DC power transmission medium in which the fault is not located, since they are not directly connected to the first terminal T1. The third and fourth DC power transmission media L3,L4 are therefore allocated a healthy status.

In the second stage, the second DC power transmission medium L2 is identified as being the DC power transmission medium in which the fault is not located, since the difference of 0.000340 s between the smallest surge arrival time and the surge arrival time at the second terminal T2 is approximately equal to a travel time of 0.000343 s for the second DC power transmission medium L2. The second DC power transmission medium L2 is therefore allocated a healthy status.

In the third stage, the fifth DC power transmission medium L5 is identified as being the DC power transmission medium in which the fault is not located, since the surge arrival time at the third terminal T3 is approximately equal to the sum value (i.e. 1.000703 s) of a travel time for the fourth DC power transmission medium L4 and the surge arrival time at the fourth terminal T4. The fifth DC power transmission medium L5 is therefore allocated a healthy status.

In this manner the first DC power transmission medium L1 is identified as the faulted DC power transmission medium in which the fault is located, when Xact=17 km. Using Equations 1 and 2, Xest=17.083 km while the error value is 0.10%.

For Xact=40 km, the measured surge arrival times for the plurality of terminals T1,T2,T3,T4 are 1.000270 s, 1.000610 s, 1.000540 s and 1.000270 s respectively.

In the first stage, the first and fourth terminals T1,T4 are both identified as having the smallest surge arrival times. Hence, the second, third, fourth and fifth DC power transmission media L2,L3,L4,L5 are each identified as being the DC power transmission medium in which the fault is not located and thereby are allocated a healthy status.

In this manner the first DC power transmission medium L1 is identified as the faulted DC power transmission medium in which the fault is located, when Xact=40 km. Using Equations 1 and 2, Xest=40.000 km while the error value is 0.00%.

For Xact=61 km, the measured surge arrival times for the plurality of terminals T1,T2,T3,T4 are 1.000415 s, 1.000760 s, 1.000395 s and 1.000125 s respectively.

In the first stage, the fourth terminal T4 is identified as having the smallest surge arrival time. Hence, the second, third and fifth DC power transmission media L2,L3,L5 are each identified as being the DC power transmission medium in which the fault is not located, since they are not directly connected to the fourth terminal T4. The second, third and fifth DC power transmission media L2,L3,L5 are therefore allocated a healthy status.

In the second stage, the fourth DC power transmission medium L4 is identified as being the DC power transmission medium in which the fault is not located, since the difference of 0.000270 s between the smallest surge arrival time and the surge arrival time at the third terminal T3 is approximately equal to a travel time of 0.000273 for the fourth DC power transmission medium L4. The fourth DC power transmission medium L4 is therefore allocated a healthy status.

In this manner the first DC power transmission medium L1 is identified as the faulted DC power transmission medium in which the fault is located, when Xact=61 km. Using Equations 1 and 2, Xest=61.098 km while the error value is 0.12%.

SECOND EXAMPLE (AS SHOWN IN FIG. 9)

In the second example, Xact is the distance of the fault from the first terminal T1 along the length of the faulted DC power transmission medium L2.

For Xact=13 km, the measured surge arrival times for the plurality of terminals T1,T2,T3,T4 are 1.000085 s, 1.000250 s, 1.000700 s and 1.000630 s respectively.

In the first stage, the first terminal T1 is identified as having the smallest surge arrival time. Hence, the third and fourth DC power transmission media L3,L4 are each identified as being the DC power transmission medium in which the fault is not located, since they are not directly connected to the first terminal T1. The third and fourth DC power transmission media L3,L4 are therefore allocated a healthy status.

In the second stage, the first DC power transmission medium L1 is identified as being the DC power transmission medium in which the fault is not located, since the difference of 0.000545 s between the smallest surge arrival time and the surge arrival time at the fourth terminal T4 is approximately equal to a travel time of 0.000550 s for the first DC power transmission medium L1. In addition the fifth DC power transmission medium L5 is identified as being the DC power transmission medium in which the fault is not located, since the difference of 0.000615 s between the smallest surge arrival time and the surge arrival time at the third terminal T3 is approximately equal to a travel time of 0.000622 s for the fifth DC power transmission medium L5. The first and fifth DC power transmission media L1,L5 are each therefore allocated a healthy status.

In this manner the second DC power transmission medium L2 is identified as the faulted DC power transmission medium in which the fault is located, when Xact=13 km. Using Equations 1 and 2, Xest=12.988 km while the error value is 0.02%.

For Xact=28 km, the measured surge arrival times for the plurality of terminals T1,T2,T3,T4 are 1.000190 s, 1.000145 s, 1.000660 s and 1.000735 s respectively.

In the first stage, the second terminal T2 is identified as having the smallest surge arrival time. Hence, the first, fourth and fifth DC power transmission media L1,L4,L5 are each identified as being the DC power transmission medium in which the fault is not located, since they are not directly connected to the second terminal T2. The first, fourth and fifth DC power transmission media L1,L4,L5 are therefore allocated a healthy status.

In the second stage, the third DC power transmission medium L3 is identified as being the DC power transmission medium in which the fault is not located, since the difference of 0.000515 s between the smallest surge arrival time and the surge arrival time at the third terminal T3 is approximately equal to a travel time of 0.000517 s for the third DC power transmission medium L3. The third DC power transmission medium L3 is therefore allocated a healthy status.

In this manner the second DC power transmission medium L2 is identified as the faulted DC power transmission medium in which the fault is located, when Xact=28 km. Using Equations 1 and 2, Xest=28.276 km while the error value is 0.55%.

For Xact=49 km, the measured surge arrival times for the plurality of terminals T1,T2,T3,T4 are 1.000335 s, 1.000005 s, 1.000515 s and 1.000795 s respectively.

In the first stage, the second terminal T2 is identified as having the smallest surge arrival time. Hence, the first, fourth and fifth DC power transmission media L1,L4,L5 are each identified as being the DC power transmission medium in which the fault is not located, since they are not directly connected to the second terminal T2. The first, fourth and fifth DC power transmission media L1,L4,L5 are therefore allocated a healthy status.

In the second stage, the third DC power transmission medium L3 is identified as being the DC power transmission medium in which the fault is not located, since the difference of 0.000510 s between the smallest surge arrival time and the surge arrival time at the third terminal T3 is approximately equal to a travel time of 0.000517 s for the third DC power transmission medium L3. The third DC power transmission medium L3 is therefore allocated a healthy status.

In this manner the second DC power transmission medium L2 is identified as the faulted DC power transmission medium in which the fault is located, when Xact=49 km. Using Equations 1 and 2, Xest=49.024 km while the error value is 0.0005%.

THIRD EXAMPLE (AS SHOWN IN FIG. 10)

In the third example, Xact is the distance of the fault from the second terminal T2 along the length of the faulted DC power transmission medium L3.

For Xact=10 km, the measured surge arrival times for the plurality of terminals T1,T2,T3,T4 are 1.000405 s, 1.000065 s, 1.000445 s and 1.000720 s respectively.

In the first stage, the second terminal T2 is identified as having the smallest surge arrival time. Hence, the first, fourth and fifth DC power transmission media L1,L4,L5 are each identified as being the DC power transmission medium in which the fault is not located, since they are not directly connected to the second terminal T2. The first, fourth and fifth DC power transmission media L1,L4,L5 are therefore allocated a healthy status.

In applying the second stage, the second DC power transmission medium L2 is identified as being the DC power transmission medium in which the fault is not located, since the difference of 0.000340 s between the smallest surge arrival time and the surge arrival time at the fourth terminal T4 is approximately equal to a travel time of 0.000343 for the second DC power transmission medium L2. The second DC power transmission medium L2 is therefore allocated a healthy status.

In this manner the third DC power transmission medium L3 is identified as the faulted DC power transmission medium in which the fault is located, when Xact=10 km. Using Equations 1 and 2, Xest=9.944 km while the error value is 0.08%.

For Xact=46 km, the measured surge arrival times for the plurality of terminals T1,T2,T3,T4 are 1.000655 s, 1.000310 s, 1.000195 s and 1.000465 s respectively.

In the first stage, the third terminal T3 is identified as having the smallest surge arrival time. Hence, the first and second DC power transmission media L1,L2 are each identified as being the DC power transmission medium in which the fault is not located, since they are not directly connected to the third terminal T3. The first and second DC power transmission media L1,L2 are therefore allocated a healthy status.

In the second stage, the fourth DC power transmission medium L4 is identified as being the DC power transmission medium in which the fault is not located, since the difference of 0.000270 s between the smallest surge arrival time and the surge arrival time at the fourth terminal T4 is approximately equal to a travel time of 0.000273 s for the fourth DC power transmission medium L4. The fourth DC power transmission medium L4 is therefore allocated a healthy status.

In the third stage, the fifth DC power transmission medium L5 is identified as being the DC power transmission medium in which the fault is not located, since the surge arrival time at the first terminal T1 is approximately equal to the sum value (i.e. 1.000653 s) of a travel time for the second DC power transmission medium L2 and the surge arrival time at the second terminal T2. The fifth DC power transmission medium L5 is therefore allocated a healthy status.

In this manner the third DC power transmission medium L3 is identified as the faulted DC power transmission medium in which the fault is located, when Xact=46 km. Using Equations 1 and 2, Xest=45.839 km while the error value is 0.21%.

For Xact=67 km, the measured surge arrival times for the plurality of terminals T1,T2,T3,T4 are 1.000670 s, 1.000455 s, 1.000050 s and 1.000320 s respectively.

In the first stage, the third terminal T3 is identified as having the smallest surge arrival time. Hence, the first and second DC power transmission media L1,L2 are each identified as being the DC power transmission medium in which the fault is not located, since they are not directly connected to the third terminal T3. The first and second DC power transmission media L1,L2 are therefore allocated a healthy status.

In the second stage, the fourth DC power transmission medium L4 is identified as being the DC power transmission medium in which the fault is not located, since the difference of 0.000270 s between the smallest surge arrival time and the surge arrival time at the fourth terminal T4 is approximately equal to a travel time of 0.000273 for the fourth DC power transmission medium L4. In addition the fifth DC power transmission medium L5 is identified as being the DC power transmission medium in which the fault is not located, since the difference of 0.000620 s between the smallest surge arrival time and the surge arrival time at the first terminal T1 is approximately equal to a travel time of 0.000622 s for the fifth DC power transmission medium L5. The fourth and fifth DC power transmission media L4,L5 are each therefore allocated a healthy status.

In this manner the third DC power transmission medium L3 is identified as the faulted DC power transmission medium in which the fault is located, when Xact=67 km. Using Equations 1 and 2, Xest=66.869 km while the error value is 0.17%.

FOURTH EXAMPLE (AS SHOWN IN FIG. 11)

In the fourth example, Xact is the distance of the fault from the fourth terminal T4 along the length of the faulted DC power transmission medium L4.

For Xact=4 km, the measured surge arrival times for the plurality of terminals T1,T2,T3,T4 are 1.000570 s, 1.000760 s, 1.000245 s and 1.000025 s respectively.

In the first stage, the fourth terminal T4 is identified as having the smallest surge arrival time. Hence, the second, third and fifth DC power transmission media L2,L3,L5 are each identified as being the DC power transmission medium in which the fault is not located, since they are not directly connected to the fourth terminal T4. The second, third and fifth DC power transmission media L2,L3,L5 are therefore allocated a healthy status.

In the second stage, the first DC power transmission medium L1 is identified as being the DC power transmission medium in which the fault is not located, since the difference of 0.000545 s between the smallest surge arrival time and the surge arrival time at the first terminal T1 is approximately equal to a travel time of 0.000550 s for the first DC power transmission medium L1. The first DC power transmission medium L1 is therefore allocated a healthy status.

In this manner the fourth DC power transmission medium L4 is identified as the faulted DC power transmission medium in which the fault is located, when Xact=4 km. Using Equations 1 and 2, Xest=3.858 km while the error value is 0.35%.

For Xact=16 km, the measured surge arrival times for the plurality of terminals T1,T2,T3,T4 are 1.000650 s, 1.000675 s, 1.000160 s and 1.000105 s respectively.

In the first stage, the fourth terminal T4 is identified as having the smallest surge arrival time. Hence, the second, third and fifth DC power transmission media L2,L3,L5 are each identified as being the DC power transmission medium in which the fault is not located, since they are not directly connected to the fourth terminal T4. The second, third and fifth DC power transmission media L2,L3,L5 are therefore allocated a healthy status.

In the second stage, the first DC power transmission medium L1 is identified as being the DC power transmission medium in which the fault is not located, since the difference of 0.000545 s between the smallest surge arrival time and the surge arrival time at the first terminal T1 is approximately equal to a travel time of 0.000550 s for the first DC power transmission medium L1. The first DC power transmission medium L1 is therefore allocated a healthy status.

In this manner the fourth DC power transmission medium L4 is identified as the faulted DC power transmission medium in which the fault is located, when Xact=16 km. Using Equations 1 and 2, Xest=15.965 km while the error value is 0.09%.

For Xact=34 km, the measured surge arrival times for the plurality of terminals T1,T2,T3,T4 are 1.000655 s, 1.000550 s, 1.000040 s and 1.000230 s respectively.

In the first stage, the third terminal T3 is identified as having the smallest surge arrival time. Hence, the first and second DC power transmission media L1,L2 are each identified as being the DC power transmission medium in which the fault is not located, since they are not directly connected to the third terminal T3. The first and second DC power transmission media L1,L2 are therefore allocated a healthy status.

In the second stage, the third DC power transmission medium L3 is identified as being the DC power transmission medium in which the fault is not located, since the difference of 0.000510 s between the smallest surge arrival time and the surge arrival time at the second terminal T2 is approximately equal to a travel time of 0.000517 s for the third DC power transmission medium L3. In addition the fifth DC power transmission medium L5 is identified as being the DC power transmission medium in which the fault is not located, since the difference of 0.000615 s between the smallest surge arrival time and the surge arrival time at the first terminal T1 is approximately equal to a travel time of 0.000622 s for the third DC power transmission medium L3. The third and fifth DC power transmission media L3,L5 are therefore allocated a healthy status.

In this manner the fourth DC power transmission medium L4 is identified as the faulted DC power transmission medium in which the fault is located, when Xact=34 km. Using Equations 1 and 2, Xest=33.941 km while the error value is 0.15%.

FIFTH EXAMPLE (AS SHOWN IN FIG. 12)

In the fifth example, Xact is the distance of the fault from the first terminal T1 along the length of the faulted DC power transmission medium L5.

For Xact=20 km, the measured surge arrival times for the plurality of terminals T1,T2,T3,T4 are 1.000135 s, 1.000475 s, 1.000480 s and 1.000680 s respectively.

In the first stage, the first terminal T1 is identified as having the smallest surge arrival time. Hence, the third and fourth DC power transmission media L3,L4 are each identified as being the DC power transmission medium in which the fault is not located, since they are not directly connected to the first terminal T1. The third and fourth DC power transmission media L3,L4 are therefore allocated a healthy status.

In the second stage, the first DC power transmission medium L1 is identified as being the DC power transmission medium in which the fault is not located, since the difference of 0.000545 s between the smallest surge arrival time and the surge arrival time at the fourth terminal T4 is approximately equal to a travel time of 0.000550 s for the first DC power transmission medium L1. In addition the second DC power transmission medium L2 is identified as being the DC power transmission medium in which the fault is not located, since the difference of 0.000340 s between the smallest surge arrival time and the surge arrival time at the second terminal T2 is approximately equal to a travel time of 0.000343 s for the second DC power transmission medium L2. The first and second DC power transmission media L1,L2 are therefore allocated a healthy status.

In this manner the fifth DC power transmission medium L5 is identified as the faulted DC power transmission medium in which the fault is located, when Xact=20 km. Using Equations 1 and 2, Xest=20.053 km while the error value is 0.06%.

For Xact=43 km, the measured surge arrival times for the plurality of terminals T1,T2,T3,T4 are 1.000290 s, 1.000630 s, 1.000320 s and 1.000590 s respectively.

In the first stage, the first terminal T1 is identified as having the smallest surge arrival time. Hence, the third and fourth DC power transmission media L3,L4 are each identified as being the DC power transmission medium in which the fault is not located, since they are not directly connected to the first terminal T1. The third and fourth DC power transmission media L3,L4 are therefore allocated a healthy status.

In the second stage, the second DC power transmission medium L2 is identified as being the DC power transmission medium in which the fault is not located, since the difference of 0.000340 s between the smallest surge arrival time and the surge arrival time at the second terminal T2 is approximately equal to a travel time of 0.000343 s for the second DC power transmission medium L2. The second DC power transmission medium L2 is therefore allocated a healthy status.

In the third stage, the first DC power transmission medium L1 is identified as being the DC power transmission medium in which the fault is not located, since the surge arrival time at the fourth terminal T4 is approximately equal to the sum value (i.e. 1.000593 s) of a travel time for the third DC power transmission medium L3 and the surge arrival time at the third terminal T3. The first DC power transmission medium L1 is therefore allocated a healthy status.

In this manner the fifth DC power transmission medium L5 is identified as the faulted DC power transmission medium in which the fault is located, when Xact=43 km. Using Equations 1 and 2, Xest=42.831 km while the error value is 0.19%.

For Xact=km, the measured surge arrival times for the plurality of terminals T1,T2,T3,T4 are 1.000520 s, 1.000605 s, 1.000090 s and 1.000365 s respectively.

In the first stage, the third terminal T3 is identified as having the smallest surge arrival time. Hence, the first and second DC power transmission media L1,L2 are each identified as being the DC power transmission medium in which the fault is not located, since they are not directly connected to the third terminal T3. The first and second DC power transmission media L1,L2 are therefore allocated a healthy status.

In the second stage, the third DC power transmission medium L3 is identified as being the DC power transmission medium in which the fault is not located, since the difference of 0.000515 s between the smallest surge arrival time and the surge arrival time at the second terminal T2 is approximately equal to a travel time of 0.000517 s for the third DC power transmission medium L3. In addition the fourth DC power transmission medium L4 is identified as being the DC power transmission medium in which the fault is not located, since the difference of 0.000275 s between the smallest surge arrival time and the surge arrival time at the fourth terminal T4 is approximately equal to a travel time of 0.000273 s for the fourth DC power transmission medium L4. The third and fourth DC power transmission media L3,L4 are therefore allocated a healthy status.

In this manner the fifth DC power transmission medium L5 is identified as the faulted DC power transmission medium in which the fault is located, when Xact=76 km. Using Equations 1 and 2, Xest=76.094 km while the error value is 0.10%.

It can be seen from FIGS. 8 to 12 that the method of FIG. 3 enables the faulted DC power transmission medium to be identified by way of elimination of each healthy DC power transmission medium on a stage-by-stage basis, as being a specific DC power transmission medium L1,L2,L3,L4,L5.

It can also be seen from FIGS. 8 to 12 that successful identification of the location of the faulted DC power transmission medium as being a specific DC power transmission medium L1,L2,L3,L4,L5 does not require completion of all of the steps of the method of FIG. 3.

It will be appreciated from each of the examples shown in FIGS. 8 to 12 that the elimination of each healthy DC power transmission medium on a stage-by-stage basis means that it is possible to at least narrow down the identity of the faulted DC power transmission medium to being in part of the DC electrical network, i.e. amongst a plurality of DC power transmission media forming part of the DC electrical network, if there was sufficient time to only complete some of the steps of the method of FIG. 3.

The method of FIG. 3 therefore not only provides a simple, accurate and reliable method of identifying a faulted DC power transmission medium in the meshed multi-terminal DC network of FIG. 3, but also minimises the inconvenience to end users by allowing at least part of the DC electrical network 20 to remain in service following occurrence of a fault.

It will be appreciated that the method according to the invention is applicable to a multi-terminal DC electrical network of a different shape and size from the DC electrical network 20 of FIG. 1, whereby the shape and size of the multi-terminal DC electrical network varies with the number of terminals and DC power transmission media in the DC electrical network.

The invention claimed is:

1. A method for identifying a faulted DC power transmission medium in a multi-terminal DC electrical network, the DC electrical network including a plurality of terminals, each terminal being connected to at least one other terminal via a respective one of a plurality of DC power transmission media, the method comprising the steps of:
   (a) detecting a fault occurring in the plurality of DC power transmission media;
   (b) after detecting the fault, measuring a surge arrival time at each terminal, each surge arrival time being the difference between the time of detecting the fault and the time of arrival of an electrical wave surge at the corresponding terminal, the electrical wave surge being generated by the fault;
   (c) comparing the surge arrival time at each terminal with the surge arrival time at at least one other terminal to identify at least one of the DC power transmission media in which the fault is not located;
   (d) allocating a healthy status to the at least one DC power transmission medium in which the fault is not located;
   (e) after allocating the healthy status to the at least one DC power transmission medium in which the fault is not located, then identifying the faulted DC power transmission medium as being the DC power transmission medium without an allocated healthy status or among a plurality of DC power transmission media without an allocated healthy status.

2. A method according to claim 1 wherein the step of comparing the surge arrival time at each terminal with the surge arrival time at at least one other terminal to identify the at least one DC power transmission medium in which the fault is not located involves the sub-step of identifying at least one of the terminals with a smallest surge arrival time from the measured surge arrival times followed by a first stage including at least one of:
   (f) if two terminals are each identified as having the smallest surge arrival time, identifying the DC power transmission medium directly connecting the two identified terminals as being the DC power transmission medium in which the fault is located, and identifying each other DC power transmission medium as being the DC power transmission medium in which the fault is not located; or
   (g) if one terminal is identified as having the smallest surge arrival time, identifying at least one of the DC power transmission media which is not directly connected to the identified terminal as being the at least one DC power transmission medium in which the fault is not located.

3. A method according to claim 2 wherein the step of comparing the surge arrival time at each terminal with the surge arrival time at at least one other terminal to identify the at least one DC power transmission medium in which the fault is not located involves the sub-step of identifying the terminal with a smallest surge arrival time from the measured surge arrival times followed by a second stage including the sub-steps of:
   (h) selecting one terminal which is not the identified terminal with the smallest surge arrival time;
   (i) determining the difference between the smallest surge arrival time and the surge arrival time at that selected terminal; and
   (j) if the difference between the smallest surge arrival time and the surge arrival time at the selected terminal is equal or higher than a travel time for the DC power transmission medium directly connecting the identified and selected terminals, identifying the DC power transmission medium directly connecting the identified and selected terminals as being the at least one DC power transmission medium in which the fault is not located, wherein a travel time for a DC power transmission medium is equal to a time required for an electrical wave to travel along that DC power transmission medium between the two terminals which are directly connected to that DC power transmission medium.

4. A method according to claim 3 wherein the second stage is repeated for each other terminal which is not the identified terminal with the smallest surge arrival time.

5. A method according to claim 3 wherein the first stage is followed by the second stage.

6. A method according to claim 3 wherein the step of comparing the surge arrival time at each terminal with the surge arrival time at at least one other terminal to identify the at least one DC power transmission medium in which the fault is not located involves the sub-steps of:
   (k) determining each path to each terminal from each other terminal, wherein each path includes at least one of the plurality of DC power transmission media, a first end of each path being connected to one of the plurality of terminals, a second end of the path being connected to another of the plurality of terminals;

(l) determining a travel time for each path, wherein the travel time for each path is the time required for an electrical wave to travel along that path between the two terminals which are directly connected to the first and second ends of that path, followed by a third stage including the sub-steps of:

(m) selecting one of the plurality of DC power transmission media, and selecting the terminals directly connected to the selected DC power transmission medium as a first selected terminal and a second selected terminal;

(n) determining whether the surge arrival time at the first selected terminal is lower or higher than the surge arrival time at the second selected terminal;

(o) selecting one path in which one of its first and second ends is directly connected to the selected terminal with the higher surge arrival time and the other of its first and second ends is not directly connected to the selected terminal with the lower surge arrival time;

(p) comparing the surge arrival time at the selected terminal with the higher surge arrival time with the sum value of a travel time for the selected path and the surge arrival time at the terminal connected to the other end of the selected path;

(q) if the surge arrival time at the selected terminal with the higher surge arrival time is equal to the sum value, identifying the DC power transmission medium directly interconnecting the first and second selected terminals as the at least one DC power transmission medium in which the fault is not located.

7. A method according to claim 6 wherein sub-steps (o), (p), (q) are repeated for each other path in which one of its first and second ends is directly connected to the selected terminal with the higher surge arrival time and the other of its first and second ends is not directly connected to the selected terminal with the lower surge arrival time.

8. A method according to claim 6 or claim 7 wherein the third stage is repeated for each of the other plurality of DC power transmission media.

9. A method according to claim 6 wherein the second stage is followed by the third stage.

10. A method according to claim 9 wherein the third stage is only carried out in respect of each DC power transmission medium which has not been identified in the second stage as being the at least one DC power transmission medium in which the fault is not located.

11. A method according to claim 1 further including the step of, in response to determining only one of the plurality of DC power transmission media does not have a healthy status, determining the location of the fault along the length of that DC power transmission medium using the following equation:

$$x_F = \frac{L - \Delta t \cdot U}{2}$$

wherein $x_F$ is the location of the fault along the length of that DC power transmission medium, L is the length of the DC power transmission medium, $\Delta t$ is the difference between the surge arrival times at the terminals directly connected to that DC power transmission medium and U is the propagation speed of the electrical wave surge.

* * * * *